US 6,559,748 B1

(12) United States Patent
Nakano

(10) Patent No.: US 6,559,748 B1
(45) Date of Patent: *May 6, 2003

(54) ELECTRIC NOISE ABSORBER

(75) Inventor: Yoshihito Nakano, Yokohama (JP)

(73) Assignee: Kitigawa Industries Co., Ltd., Nagoya (JP)

(*) Notice: Subject to any disclaimer, the term of this patent is extended or adjusted under 35 U.S.C. 154(b) by 0 days.

This patent is subject to a terminal disclaimer.

(21) Appl. No.: 08/217,079

(22) Filed: Mar. 24, 1994

Related U.S. Application Data

(63) Continuation of application No. 07/923,814, filed on Aug. 3, 1992, now abandoned, which is a division of application No. 07/870,801, filed on Apr. 17, 1992, now abandoned, which is a continuation of application No. 07/693,691, filed on Apr. 30, 1991, now abandoned, which is a division of application No. 07/407,588, filed on Sep. 15, 1989, now abandoned, which is a division of application No. 07/205,578, filed on Jun. 6, 1988, now Pat. No. 4,885,559, which is a continuation of application No. 07/025,059, filed on Mar. 12, 1987, now abandoned.

(30) Foreign Application Priority Data

Aug. 29, 1986 (JP) .............................. 61-133476

(51) Int. Cl.⁷ .............................................. H01F 17/06
(52) U.S. Cl. ...................................................... 336/176
(58) Field of Search ........................... 336/92, 175, 176

(56) References Cited

U.S. PATENT DOCUMENTS

| 3,018,455 A | 1/1962 | Brandon, Jr. et al. |
| 3,147,338 A | 9/1964 | Ekvall et al. |
| 3,183,302 A | 5/1965 | Worhner et al. |
| 3,219,930 A | 11/1965 | Sipler |
| 3,223,776 A | 12/1965 | Piasecki |
| 3,229,030 A | 1/1966 | Baermann |
| 3,241,198 A | 3/1966 | Baermann |
| 3,278,674 A | 10/1966 | Matthysse et al. |

(List continued on next page.)

FOREIGN PATENT DOCUMENTS

| DE | 624455 | 1/1936 |
| DE | 11729 | 9/1956 |
| DE | 144981 | 7/1979 |
| JP | 50-27527 | 8/1975 |
| JP | 129316 | 10/1979 |
| JP | 55-12829 | 4/1980 |
| JP | 56-3561 | 1/1981 |
| JP | 56-80648 | 6/1981 |
| JP | 56-106076 | 8/1981 |
| JP | 57-85756 | 5/1982 |
| JP | 57-142897 | 9/1982 |
| JP | 58-51495 | 8/1983 |
| JP | 60-16404 | 1/1985 |
| JP | 61-34705 | 3/1986 |
| JP | 61-38714 | 3/1986 |
| JP | 61-76626 | 5/1986 |
| JP | 61-97899 | 6/1986 |
| JP | 61-116021 | 7/1986 |
| JP | 61-129475 | 8/1986 |
| JP | 6214770 | 4/1987 |

OTHER PUBLICATIONS

Japanese Inventor Association Publication No. 83–12248 published on Nov. 21, 1983 (its abstract is enclosed herewith).

*Primary Examiner*—Anh Mai
(74) *Attorney, Agent, or Firm*—Davis & Bujold, P.L.L.C.

(57) ABSTRACT

An electric noise absorber for clamping to a cord of an electronic device comprises a holding case composed of two box-shaped case members. Each case member contains a magnet having a hemi-cylindrical groove at the upper part of the magnet for receiving the cord. It is possible to easily and securely attach and detach the electric noise absorbing magnet to the cord by simply closing and opening the case members.

21 Claims, 5 Drawing Sheets

U.S. PATENT DOCUMENTS

| | | |
|---|---|---|
| 3,325,591 A | 6/1967 | Wahl |
| 3,374,434 A | 3/1968 | Perry |
| 3,462,715 A | 8/1969 | Schor |
| 3,514,731 A | 5/1970 | Drake |
| 3,684,955 A | 8/1972 | Adams |
| 3,711,633 A | 1/1973 | Ghirardi et al. |
| 3,838,213 A | 9/1974 | Georgopulos et al. |
| 3,846,725 A | 11/1974 | Mears, Jr. |
| 4,005,380 A | 1/1977 | Heilmann et al. |
| 4,049,357 A | 9/1977 | Hamisch, Jr. |
| 4,071,824 A | 1/1978 | Kernander et al. |
| 4,263,549 A | 4/1981 | Toppeto |
| 4,336,806 A | 6/1982 | Eldridge |
| 4,426,108 A | 1/1984 | Kesselmen |
| 4,593,276 A | 6/1986 | Aida et al. |
| 4,728,919 A | 3/1988 | Dirmeyer |

ELECTRIC NOISE ABSORBER

This is a continuation of application Ser. No. 07/923,814** filed on Aug. 3, 1992 now abandoned which designated the U.S.

**Rule 60 Divisional of U.S. Ser. No. 07/870,801 filed Apr. 17, 1992, now abandoned which is a Continuation of U.S. Ser. No. 07/693,691 filed Apr. 30, 1991, now abandoned which is a Rule 60 Divisional of U.S. Ser. No. 07/407,588 filed Sep. 15, 1989, now abandoned which is a Divisional of Ser. No. 07/205,578 filed Jun. 6, 1988 (U.S. Pat. No. 4,885,559) which is a Continuation of Ser. No. 07/025,059 filed Mar. 12, 1987 (now abandoned).

BACKGROUND OF THE INVENTION

This invention relates to an electric noise absorber for absorbing electric noise which is generated within an electronic device or which enters from the outside into the device through a cord.

As a method for absorbing such noise, it is well-known that magnetic ferrite can be attached to a cord. In this method, two pieces of half ring-shaped ferrite are simply attached by adhesive tape around the cord, therefore, the pieces are apt to easily come off from the cord. Moreover it is troublesome to attach the separate pieces to the cord or to detach the adhesive tape. Furthermore, when a conductive ferrite is employed, it may make a short circuit or may generate a contact electricity in the electronic device.

SUMMARY OF THE INVENTION

It is an object of this invention to provide an electric noise absorber in which a magnetic substance can be held securely to a cord for a long time.

It is another object of this invention to provide an absorber which can be easily attached to and detached from the cord, whenever required.

It is a further object of this invention to provide an absorber which can effectively absorb electric noise and prevent the generation and inflow of noise.

These objects and other related objects are realized by an electric noise absorber of the invention which includes: two magnets, each having a hemi-cylindrical groove for receiving the cord; and two case members for covering the cord when interlocked. Each case member contains one magnet.

BRIEF DESCRIPTION OF THE DRAWINGS

This invention is illustrated diagrammatically in the following drawings wherein.

DETAILED DESCRIPTION OF PREFERRED EMBODIMENTS

The first embodiment of this invention will be described with reference to FIGS. 1 through 13.

Figure 1:
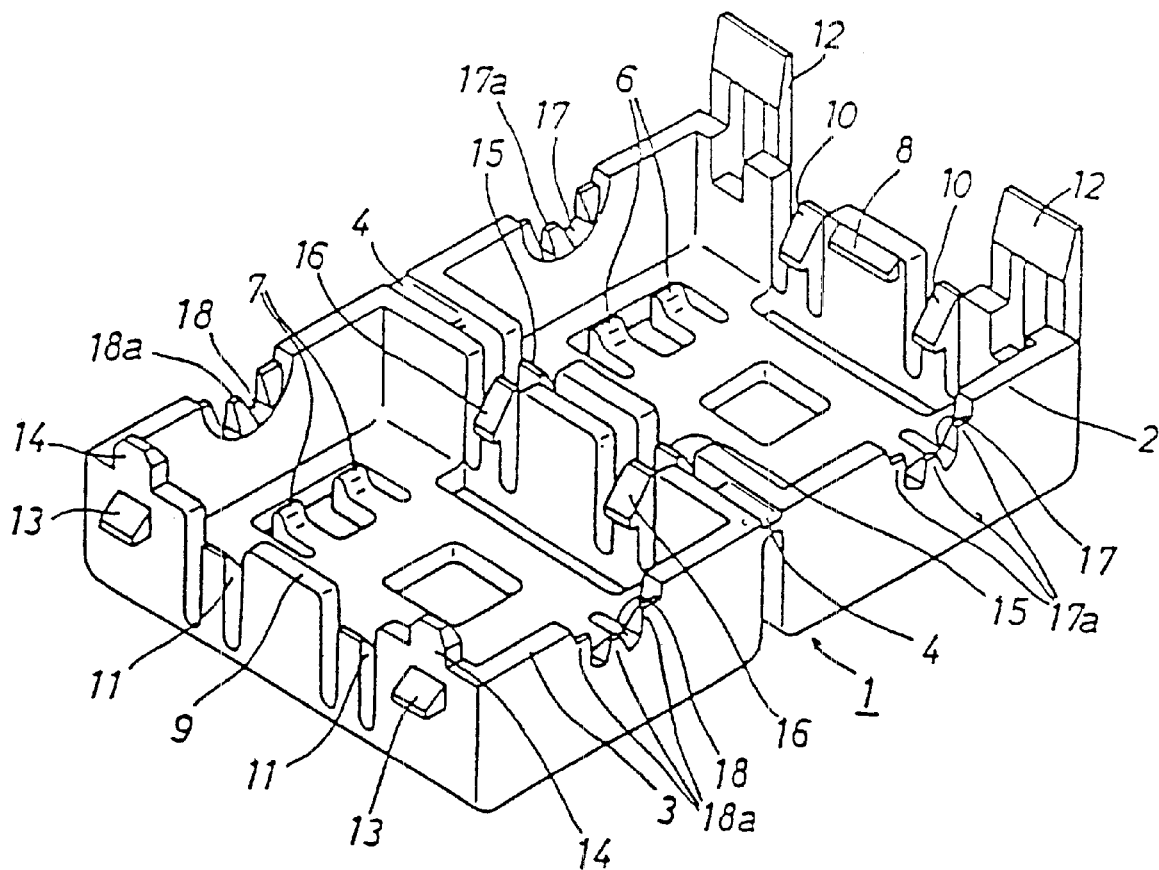
FIG. 1 is a perspective view illustrating a holding case of the first embodiment.
Figure 2:
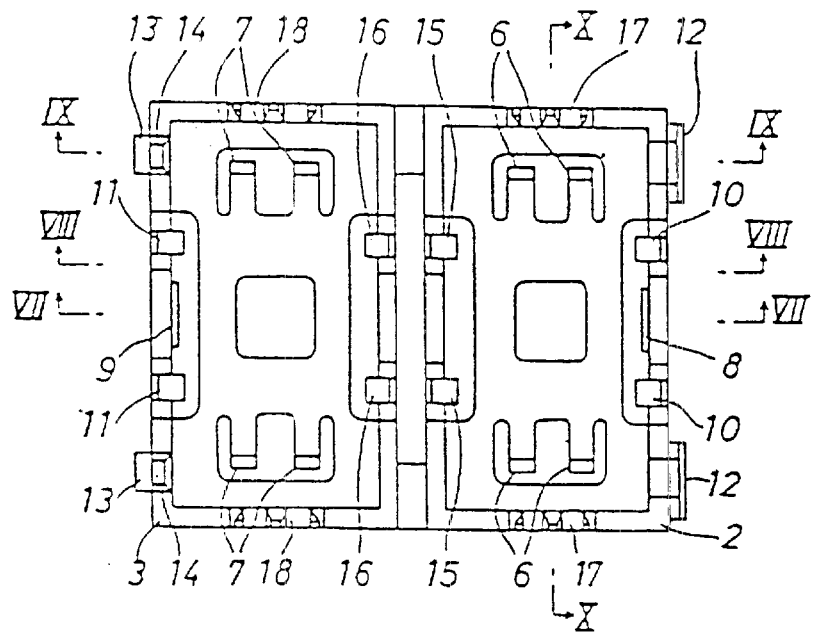
FIG. 2 is a plan view of the holding case shown in FIG. 1.
Figure 3:
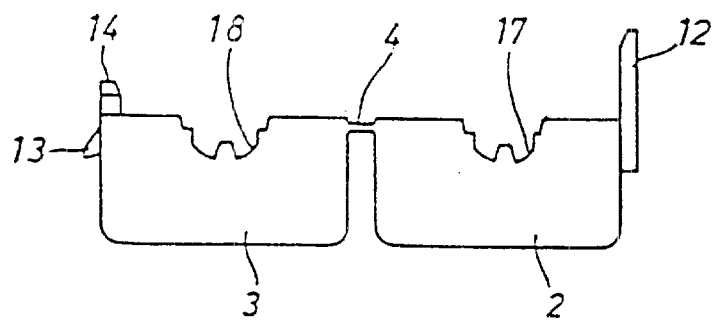
FIG. 3 is a left side view of the holding case shown in FIG. 1.
Figure 4:
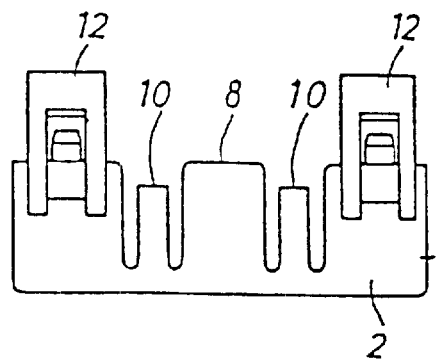
FIG. 4 is a front view of the holding case shown in FIG. 1.
Figure 5:
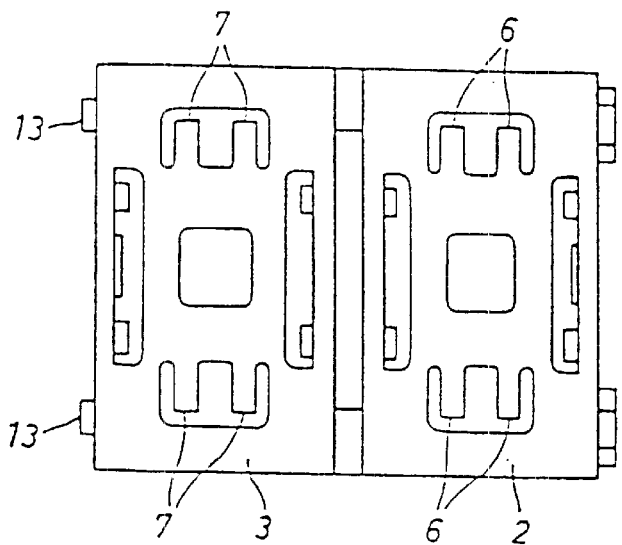
FIG. 5 is a bottom view of the holding case shown in FIG. 1.
Figure 11:
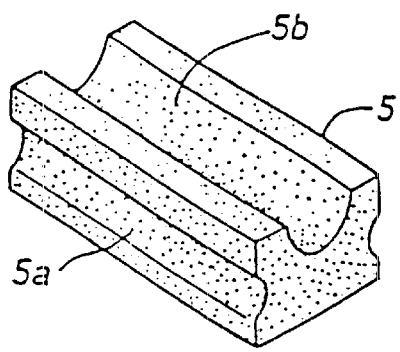
FIG. 11 is a perspective view illustrating a ferrite member.
Figure 12:
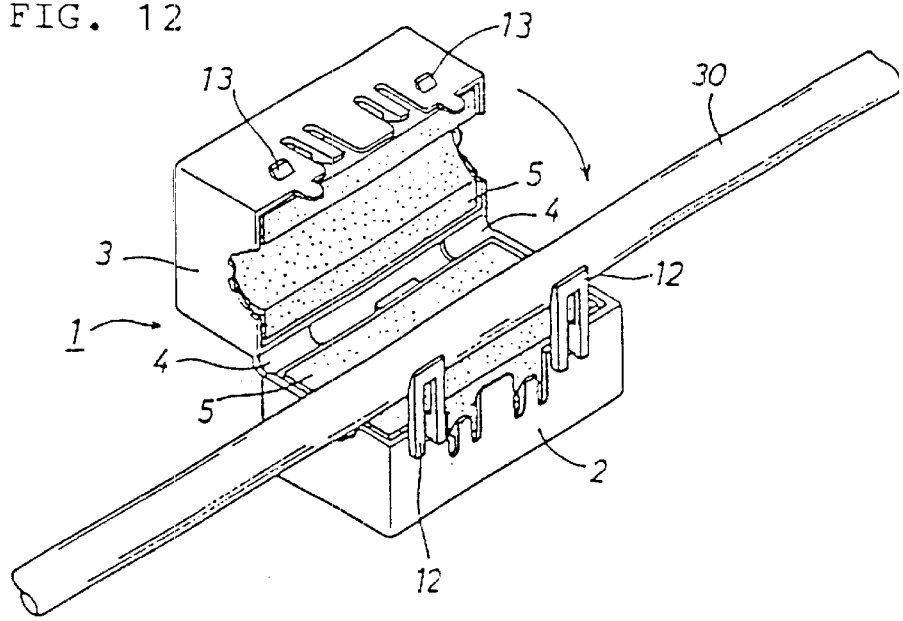
FIG. 12 is a perspective view when an electric noise absorber is attached to a cord.

FIG. 1 shows a perspective view of a holding case 1 of an electric noise absorber. The holding case 1 is composed of two case members 2 and 3 connected by means of two hinges 4. The case members 2 and 3 are box-shaped with one open surface and formed so as to securely contain a ferrite member 5 shaped as shown in FIG. 11. Four biasing members 6 and 7 project resiliently inward from the bottom of the case members 2 and 3 for biasing the ferrite member 5. Wide fixing members 8 and 9 are provided at the center of the front surface (the surface shown in FIGS. 4 and 6) of the case members 2 and 3 for securing an upper side of the ferrite member 5. Two pairs of flexible supporting projections 10 and 11 are formed adjacent to the fixing members 8 and 9. Within the case member 2, a pair of supporting projections 15 projects inward from a surface opposite to the projections 10. Within the case member 3, a pair of supporting projections 16 projects inward from a surface opposite to the projections 11. The projections 10, 11, 15 and 16 project inward from the front surface so as to support side grooves 5a of the ferrite member 5. Moreover, long engaging tabs 12 are provided adjacent to the projections 10 of the case member 2. Engaging projections 13 and protrusions 14 are provided adjacent to the projections 11 of the case member 3. The projections 13 are engaged with the tabs 12 when the holding case 1 is closed. Substantially-semi holes 17 having teeth 17a are formed on both side walls of the case member 2 for inserting a cord. Likewise, semi-holes 18 having teeth 18a are formed on both side walls of the case member 3.

As shown in FIG. 11, a hemi-cylindrical groove 5b is formed longitudinally along the upper part of the ferrite member 5 for receiving the cord. The side grooves 5a are formed on both sides of the ferrite member 5.

The holding case 1 is integrally formed of a synthetic resin, and each member, projection and tab have appropriate resilience.

Two ferrite members 5 are contained in the case members 2 and 3 of the holding case 1. In the case member 2, the upper side of the ferrite member 5 is secured by the fixing member 8. Two pairs of supporting projections 10 and 15 engage with the side grooves 5a, therefore the ferrite member 5 is securely held in the member 2. Likewise, in the case member 3, the upper side of the ferrite member 5 is secured by the fixing member 9, and two pairs of the projections 11 and 16 engage with the side grooves 5a. Thus the ferrite member 5 is securely held within the case member 3.

Figure 13:
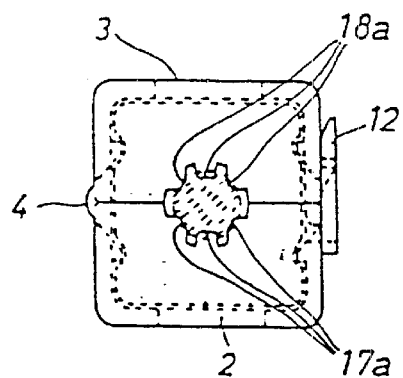
FIG. 13 is a left side view illustrating the absorber attached to the cord.

In the state that the ferrite members 5 are contained in the case members 2 and 3, a cord 30 is inserted between the case members 2 and 3, and the case member 3 covers the case member 2 so that the case 1 is attached to the cord 30 of an electronic device. The engaging projections 13 of the case member 3 are engaged with the engaging tabs 12 of the case member 2, therefore the case 1 is securely fastened. When the case 1 is closed, the biasing members 6 and 7 projecting from the bottom of the case members 2 and 3 support the ferrite members 5 so as to join them together, thereby, the ferrite members 5 are securely held. As shown in FIG. 13, the teeth 17a and 18a, around the semi-holes 17 and 18 formed on both side walls of the case members 2 and 3, are clamped against the cord 30.

By applying an appropriate number of the holding cases 1 containing the magnetic ferrite members 5 to the cord 30, noise flowing in the cord 30 is absorbed by the magnetic ferrite and generation of noise is prevented. The noise absorbing efficiency of the case 1 is measured at various positions thereof along the cord by a noise measuring device, and the position for the case where noise is absorbed most efficiently is found. It is preferable that the most appropriate number of the cases to be used are experimentally determined by measuring the noise absorbing efficiency. The ferrite members 5 absorb noise that is generated outside or enters the electronic device through the cord.

To detach the case from the cord or to change its position thereon, the engaging tabs 12 of the case member 2 are pulled outwardly so that the tabs 12 detach easily from the engaging projections 13 and the case 1 can be opened. It is possible to secure the holding case 1 to a circuit board with a double-sided adhesive tape.

Figure 6:
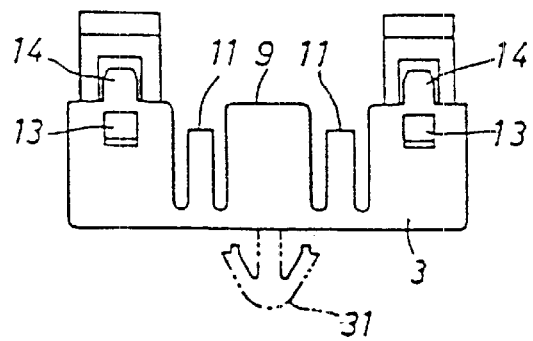
FIG. 6 is a rear view of the holding case shown in FIG. 1.
Figure 7:
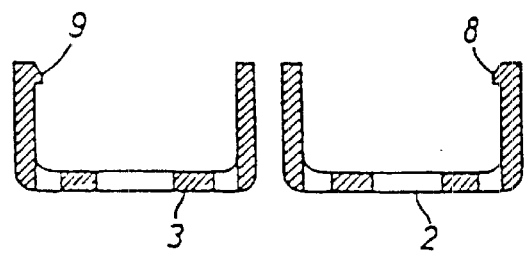
FIG. 7 is a sectional view taken along line VII—VII of FIG. 2.
Figure 8:
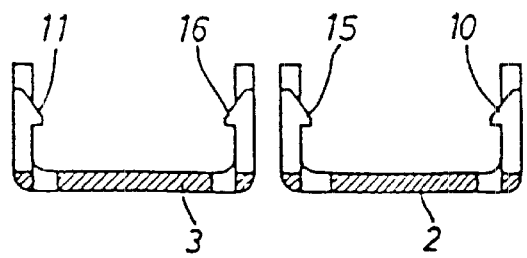
FIG. 8 is a sectional view taken along line VIII—VIII of FIG. 2.
Figure 9:
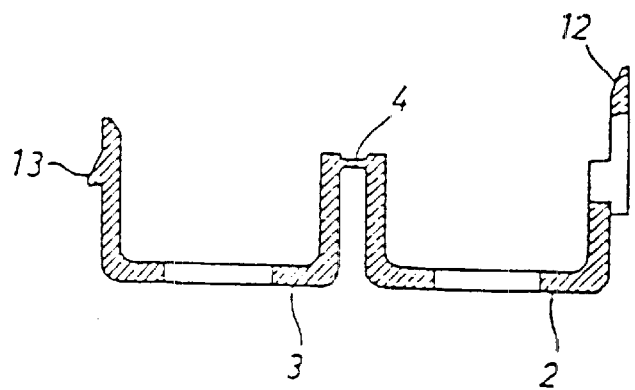
FIG. 9 is a sectional view taken along line IX—IX of FIG. 2.
Figure 10:
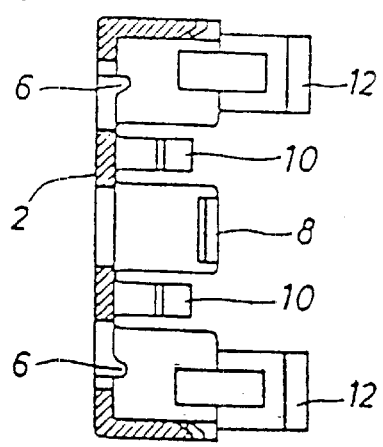
FIG. 10 is a sectional view taken along line X—X of FIG. 2.

As shown by a double-dash interrupted line in FIG. 6, a mounting leg 31 having an engaging hook may be attached to the bottom of the case member 2 or 3 so as to secure the holding case to the circuit board.

Regarding the magnetic substance, either hard or soft ferrite can be used. Further, a plastic magnet or rubber magnet which is made by mixing magnetic powder of ferrite with plastic or rubber can also be used.

Figure 14:
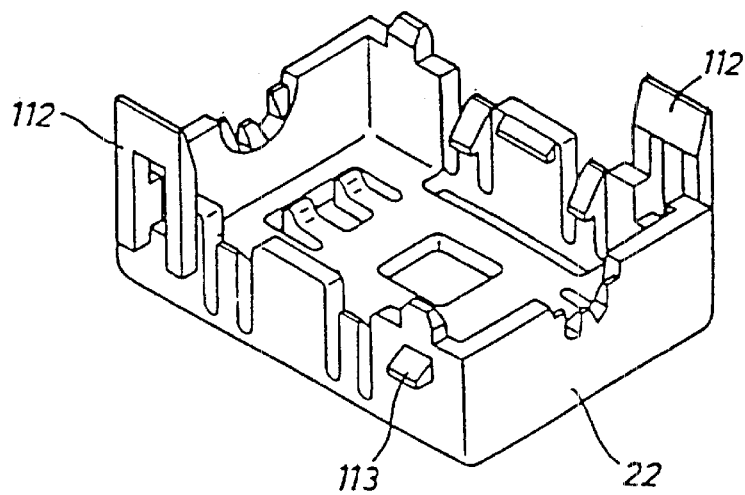
FIG. 14 is a perspective view illustrating a case member of the second embodiment.

The second embodiment of this invention is shown in FIG. 14. In this embodiment, an engaging tab 112 and a projection 113 are formed on each of the sides of a single case member 22. Another projection 113 is also provided opposite to the engaging tab 112. In order to secure the cord 30, two same case members 22 are prepared, and one ferrite member 5 is contained in each case member. Then the cord 30 is held between a pair of case members 22 and the engaging tab 112 is engaged with the projection 113.

Obviously many modifications and variations of the present invention are possible in the light of the above teachings. It is therefore to be understood that within the scope of the appended claims in the invention may be practiced otherwise than as specifically described.

What is claimed is:

1. An electric noise absorber for surrounding a cord of an electronic device comprising:
    two bodies of a magnetic substance, each said body having a hemi-cylindrical groove for receiving the cord;
    two case members for covering the cord when interlocked, each case member having two opposed end walls and containing one said body; and
    means for selectively interlocking said case members with one another such that said bodies surround said cord;
    means integrally formed in said case members, during manufacture of said case members, for resiliently retaining each body in its associated case member even when said case members are separated from one another; and
    wherein a hemi-hole is formed on each of the opposed end walls of the case members for passage of the cord to and from the groove;
    teeth are integrally formed along an edge of at least one of the hemi-holes of each opposed end of said noise absorber for directly securing the cord when the case members are closed, at least a root portion of said teeth of said at least one of the hemi-holes lies in a plane defined by one of said end walls of said case member and said teeth extend from said root portion; and
    said means for resiliently retaining each body within the associated case member allows the body to move freely relative to the associated case member while preventing the body from being inadvertently removed from the associated case member when said case members are separated from one another.

2. The electric noise absorber according to claim 1, wherein the two case members form halves of one body and are connected by a hinge and each said case member has means for engaging with the other such that the case members clamp around the cord.

3. The electric noise absorber according to claim 2, wherein:
    each said case member has one open surface;
    the hinge is formed along a longitudinal edge of the open surface; and
    the engaging means are formed on another longitudinal edge of the open surface.

4. The electronic noise absorber according to claim 3, wherein each said case member has biasing means on a surface opposite to the open surface for biasing the body to the cord when the case members are closed.

5. The electric noise absorber according to claim 4, wherein one of the case members has a hook projecting outside of the case member on the surface opposite to the open surface for securing said case member to a circuit board.

6. The electric noise absorber according to claim 1, wherein the two case members are formed separately and are the same as each other and said each case member has means for engaging with each other such that the case members clamp around the cord.

7. The electric noise absorber according to claim 6, wherein:
    said each case member has one open surface; and
    the engaging means are formed along a longitudinal edge of the open surface.

8. The electric noise absorber according to claim 1, wherein said means for resiliently retaining are recess means defined by each said body and detent means define by each case member for engagement with the recess means.

9. The electric noise absorber according to claim 8, wherein said each case member has biasing means on a surface opposite to the open surface for biasing the body to the cord when the case members are closed.

10. The electric noise absorber according to claim 9, wherein one of the case members has a hook projecting outside of the case member on the surface opposite to the open surface for securing the case member to a circuit board.

11. The electrical noise absorber according to claim 8, wherein the recess means of each said body are side grooves and the detent means of each said case member are flexible projections for engagement with the side grooves.

12. The electric noise absorber according to claim 1 wherein the teeth are formed on an edge of all of the hemi-holes.

13. The electric noise absorber according to claim 1 wherein the teeth extend radially inwardly.

14. The electric noise absorber according to claim 1, wherein one of the case members has a hook projecting outside of the case member on the surface opposite to the open surface for securing the case member to a circuit board.

15. An electrical noise absorber according to claim 1, wherein said means for resiliently retaining each body in its associated case member at least allows movement of the body perpendicular to a surface opposite an open surface of that associated case member.

16. The electric noise absorber according to claim 1 wherein, when said two case members are mated with one another, the two surfaces opposite to said openings are spaced from one another a sufficient distance so that said two bodies can be accommodated therebetween and be freely movable relative to the associated case members.

17. An electric noise absorber for surrounding a cord of an electronic device comprising:
   two bodies of a magnetic substance, each said body having a hemi-cylindrical groove for receiving the cord;
   two case members for covering the cord when interlocked, each case member having two opposed end walls and containing one said body; and
   means for selectively interlocking said case members with one another such that said bodies surround said cord; and
   a retaining member being integrally formed in a side wall of each said case member, during manufacture thereof, for resiliently retaining each body in its associated case member even when said case members are separated from one another;
   wherein a hemi-hole is formed on each of the opposed end walls of the case members for passage of the cord to and from the groove;
   teeth are integrally formed along an edge of at least one of the hemi-holes of each opposed end for directly securing the cord when the case members are closed; ends of said teeth terminate along a curve such that the ends of all the teeth together define a curved face for engaging and securing the cord; at least a root portion of said teeth of said at least one of the hemi-holes lies in a plane defined by one of said end walls of said case member and said teeth extend from said root portion; and
   said resilient retaining member allows the body to move freely relative to the associate case member while preventing the body from being inadvertently removed from the associate case member when said case members are separated from one another.

18. An electrical noise absorber according to claim 17, wherein said means for resiliently retaining each body in its associated case member at least allows movement of the body perpendicular to a surface opposite an open surface of that associated case member.

19. The electric noise absorber according to claim 17, wherein, when said two case members are mated with one another, the two surfaces opposite to said openings are spaced from one another a sufficient distance so that said two bodies can be accommodated therebetween and be freely movable relative to the associated case members.

20. An electric noise absorber for surrounding a cord of an electronic device comprising:
   two bodies of a magnetic substance, each said body having a hemi-cylindrical groove for receiving the cord;
   two case members for covering the cord when interlocked, each case member having two opposed end walls and at least one side wall and encasing and containing one said body therein; and
   means for selectively interlocking said case members with one another such that said bodies surround said cord; and
   a retaining member being integrally formed in the at least one side wall of each said case member, during manufacture thereof, thereby to form a single piece with the case member for resiliently retaining each body in its associated case member even when said case members are separated from one another;
   wherein a hemi-hole is formed on each of the opposed end walls of the case members for passage of the cord to and from the groove; and the two opposed end walls and the at least one side limit movement of the associated body within the case member;
   teeth are integrally formed along an edge of at least one of the hemi-holes of each opposed end for directly engaging and securing the cord to said electric noise absorber when the case members are closed; ends of said teeth terminate along a curved path such that the ends of all the teeth together define a curved face for engaging and securing the cord; at least a root portion of said teeth of said at least one of the hemi-holes lies in a plane defined by one of said end walls of said case member and said teeth extend from said root portion; and
   said resilient retaining member allows the body to move freely relative to the associate case member while preventing the body from being inadvertently removed from the associate case member when said case members are separated from one another.

21. The electric noise absorber according to claim 20, wherein said teeth are tapered and a substantial portion each of said tapered teeth extend along the plane defined by one of said end walls.

* * * * *